United States Patent
Kim et al.

(10) Patent No.: US 7,914,621 B2
(45) Date of Patent: Mar. 29, 2011

(54) VAPOR DEPOSITION SOURCE AND VAPOR DEPOSITION APPARATUS HAVING THE SAME

(75) Inventors: Do Geun Kim, Suwon-si (KR); Myung Soo Huh, Suwon-si (KR); Seok Heon Jeong, Yongin-si (KR); Hee Cheol Kang, Suwon-si (KR); Kazuo Furuno, Yongin-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 115 days.

(21) Appl. No.: 11/342,681

(22) Filed: Jan. 31, 2006

(65) Prior Publication Data

US 2006/0169211 A1   Aug. 3, 2006

(30) Foreign Application Priority Data

Jan. 31, 2005   (KR) ........................ 10-2005-0008793
Apr. 15, 2005   (KR) ........................ 10-2005-0031684

(51) Int. Cl.
*C23C 16/00* (2006.01)
(52) U.S. Cl. ........................................ 118/726
(58) Field of Classification Search .................. 118/726, 118/727; 392/389
See application file for complete search history.

(56) References Cited

U.S. PATENT DOCUMENTS

| | | | | |
|---|---|---|---|---|
| 2,440,135 A | * | 4/1948 | Alexander | 427/248.1 |
| 5,034,604 A | * | 7/1991 | Streetman et al. | 250/251 |
| 5,803,976 A | * | 9/1998 | Baxter et al. | 118/726 |
| 5,827,371 A | * | 10/1998 | Colombo et al. | 118/726 |
| 6,310,281 B1 | * | 10/2001 | Wendt et al. | 136/256 |
| 6,444,043 B1 | * | 9/2002 | Gegenwart et al. | 118/726 |

(Continued)

FOREIGN PATENT DOCUMENTS

CN   1320172   10/2001

(Continued)

OTHER PUBLICATIONS

Random House Webster's Unabridged Dictionary, Random House, New York, 2001, pp. 61, 193 and 195.*

(Continued)

*Primary Examiner* — Keath T Chen
(74) *Attorney, Agent, or Firm* — Robert E. Bushnell, Esq.

(57) ABSTRACT

A vapor deposition source has a reduced size by disposing a crucible, a heating portion, and a nozzle portion in one defined space. A vapor deposition apparatus deposits deposition materials on a substrate using the vapor deposition source. The vapor deposition source includes a housing, and the crucible is mounted in the housing for vaporizing the deposition materials. The heating portion is installed adjacent to the crucible in the housing for heating the crucible. The nozzle portion injects the vaporized deposition materials into a substrate disposed at an exterior of the housing through an injection nozzle. The vapor deposition source is manufactured in a smaller and lightweight form in comparison with conventional vapor deposition sources in which a crucible and a nozzle portion are arranged in different spaces. The diameter and number of injection nozzles of the invention are restricted to block radiant heat discharged from the vapor deposition source, so that deposition materials are uniformly deposited. Furthermore, the output power of a conveyer for conveying the vapor deposition source is reduced. In addition, a plurality of vapor deposition sources is arranged in a line to perform concentrated deposition of deposition materials so that quality of the resultant product is improved.

4 Claims, 6 Drawing Sheets

U.S. PATENT DOCUMENTS

| | | | |
|---|---|---|---|
| 6,830,626 B1 * | 12/2004 | Smith | 118/726 |
| 2001/0011524 A1 * | 8/2001 | Witzman et al. | 118/718 |
| 2003/0015140 A1 * | 1/2003 | Van Slyke et al. | 118/723 VE |
| 2003/0054100 A1 * | 3/2003 | Eser et al. | 427/248.1 |
| 2003/0101937 A1 * | 6/2003 | Van Slyke et al. | 118/726 |
| 2004/0031442 A1 * | 2/2004 | Yamazaki et al. | 118/727 |
| 2004/0163600 A1 * | 8/2004 | Hoffmann et al. | 118/726 |
| 2004/0261709 A1 * | 12/2004 | Sakata | 118/718 |
| 2005/0034810 A1 * | 2/2005 | Yamazaki et al. | 156/345.3 |
| 2005/0051097 A1 * | 3/2005 | Koninckx et al. | 118/726 |
| 2005/0066901 A1 * | 3/2005 | Isoda | 118/726 |
| 2007/0186852 A1 * | 8/2007 | Sakata et al. | 118/719 |

FOREIGN PATENT DOCUMENTS

| | | | |
|---|---|---|---|
| DE | 4439519 | * | 4/1996 |
| JP | 05-140735 | | 6/1993 |
| JP | 07-331415 | | 12/1995 |
| JP | 2002-317261 | | 10/2002 |
| JP | 2003-502494 | | 1/2003 |
| JP | 2003077662 | * | 3/2003 |
| JP | 2004-134250 | | 4/2004 |
| KR | 2002-0021937 | * | 3/2002 |
| KR | 10-2004-0110718 | | 12/2004 |

OTHER PUBLICATIONS

Random House Webster's Unabridged Dictionary, 2nd Ed., 2001, p. 2116.*

English translation of JP 2003077662, Kido, Mar. 2003.*

*Office action* from the Chinese Patent Office issued in Applicant's corresponding Chinese Patent Application 2005-10092373.720 dated Jun. 20, 2008.

Office action from the Japanese Patent Office issued in Applicant's corresponding Japanese Patent Application No. 2005-190562 dated Mar. 17, 2009.

* cited by examiner

VAPOR DEPOSITION SOURCE AND VAPOR DEPOSITION APPARATUS HAVING THE SAME

CLAIM OF PRIORITY

This application makes reference to, incorporates the same herein, and claims all benefits accruing under 35 U.S.C. §119 from applications for VAPOR DEPOSITION SOURCE AND VAPOR DEPOSITION APPARATUS HAVING THE SAME earlier filed in the Korean Intellectual Property Office on 31 Jan. 2005 and 15 Apr. 2005, and there duly assigned Serial Nos. 2005-8793 and 2005-31684, respectively.

BACKGROUND OF THE INVENTION

1. Technical Field

The present invention relates to a vapor deposition source and a vapor deposition apparatus having the same, and more particularly to a vapor deposition source including a housing, a crucible and a nozzle portion mounted in the housing, and a vapor deposition apparatus having the same.

2. Related Art

Generally, vapor deposition apparatuses are used to deposit a thin film on various kinds of electronic components, and more particularly to form a thin film on semiconductor devices and display devices, such as liquid crystal displays and organic light emitting displays.

Organic light emitting displays inject electrons and holes from an electron injection cathode and a hole injection anode, respectively, into an emitting layer, the injected electrons and holes being combined with each other to generate exiton. When the exiton changes from an excited state to a ground state, the organic light emitting displays emit light.

In order to increase the luminous efficiency of an organic light emitting display, electrons and holes should be more easily transported into an emitting layer. To perform this operation, an electron transfer layer (ETL) can be arranged between an electron injection cathode and an organic emission layer, and a hole transfer layer can be disposed between a hole injection anode and the organic emission layer.

Furthermore, a hole injection layer (HIL) may be arranged between the hole injection anode and the hole transfer layer, and an electron injection layer (EIL) may be arranged between the electron injection cathode and the electron transfer layer (ETL).

Typical methods of forming a thin film on a substrate include evaporation, physical vapor deposition (PVD) such as ion-plating and sputtering, and chemical vapor deposition (CVD) using gas reaction. Among them, evaporation is widely used to form a thin film, such a metal film, on the organic light emitting display. An indirect heating type (induction heating type) vapor deposition source has been used as a vapor deposition source of the evaporation. In the indirect heating type (induction heating type) vapor deposition source, a device for heating deposition materials in a crucible to a predetermined temperature (approximately 1200° C. in the case of Al) is required. The heating device includes a heater for heating the crucible, and a nozzle portion for injecting deposition materials discharged from the heated crucible into a substrate. In addition, a plurality of adiabatic materials is disposed over the entirety of the vapor deposition source in order to prevent heat of high temperature created by the heater from being discharged to the exterior of the vapor deposition source.

However, in the construction of the vapor deposition source, a crucible and a heater for heating the crucible are disposed at one defined space, and the nozzle portion is disposed at another defined space so as to pass through the crucible. Adiabatic materials for blocking heat are formed not only at the crucible and the nozzle, but also at a portion connecting the crucible and the nozzle portion.

This causes the volume of the vapor deposition source to be increased. Because adiabatic materials should be installed at a large vapor deposition source, installation cost of the adiabatic materials is also increased. Moreover, a conveyer for conveying the vapor deposition source requires high power.

SUMMARY OF THE INVENTION

Accordingly, it is an object of the present invention to provide a vapor deposition source having a reduced size by disposing a crucible, a heating portion and a nozzle portion at one defined space, and to provide a vapor deposition apparatus for depositing deposition materials on a substrate using the vapor deposition source.

The foregoing and/or other aspects of the present invention are achieved by providing a vapor deposition source comprising: a housing; a crucible mounted in the housing for vaporizing deposition materials; a heating portion installed adjacent to the crucible in the housing for heating the crucible; and a nozzle portion installed so as to inject the vaporized deposition materials through an injection nozzle into a substrate disposed at an exterior of the housing.

Preferably, the heating portion includes at least one plate heater installed to heat the crucible, and having the shape of a plate which is alternatively bent at the right and left sides so as to have a predetermined unit width.

More preferably, the housing comprises a cooling jacket having a cooling passage, one continuous pipe being bent to form the cooling passage which is arranged uniformly over the entirety of the cooling jacket. A plurality of pipes is disposed at respective parts of the cooling jacket so as to form the cooling passage. Most preferably, an adiabatic portion is disposed between the heating portion and the housing for performing a heat blocking function, the adiabatic portion being formed by one adiabatic material or a plurality of adiabatic materials disposed so as to overlap with each other. The adiabatic material is preferably made of graphite felt, and the adiabatic portion further includes a nozzle adiabatic material disposed so as to enclose an injection nozzle.

In addition, the adiabatic portion includes a heat blocking plate disposed at an inner surface of an injection port for blocking heat radiated through an injection nozzle. In this embodiment, the injection nozzle has a diameter of 5 to 15 mm, and one to twenty injection nozzles are selectively disposed for a substrate having a length of 1 m. Moreover, the heat blocking plate includes a first heat blocking plate disposed at an inner surface of an injection port and at a peripheral surface of a part of the housing adjacent to the injection portion, and the heat blocking plate includes a second heat blocking plate protruding from a peripheral surface of the housing defined to include the first heat blocking plate.

According to a second aspect of the present invention, a vapor deposition apparatus comprises a vapor deposition source having the construction described above, and a conveyer installed to convey the vapor deposition source.

Preferably, the conveyer conveys the vapor deposition source along a guide member using a ball screw rotated by a motor. More preferably, a plurality of the vapor deposition sources is vertically disposed in such a way that deposition materials injected from stopped vapor deposition sources are converged into a predetermined position of a substrate, each nozzle of the vapor deposition sources being disposed so as to be inclined in order to converge the deposition material into the substrate, and the vapor deposition sources being disposed so as to be inclined in order to converge the deposition materials into the substrate. Most preferably, each vapor deposition source includes: a housing; a crucible mounted in the housing for vaporizing deposition materials; a heating portion installed adjacent to the crucible in the housing for heating the crucible; and a nozzle portion installed so as to inject the vaporized deposition materials through an injection nozzle into a substrate disposed at an exterior of the housing.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
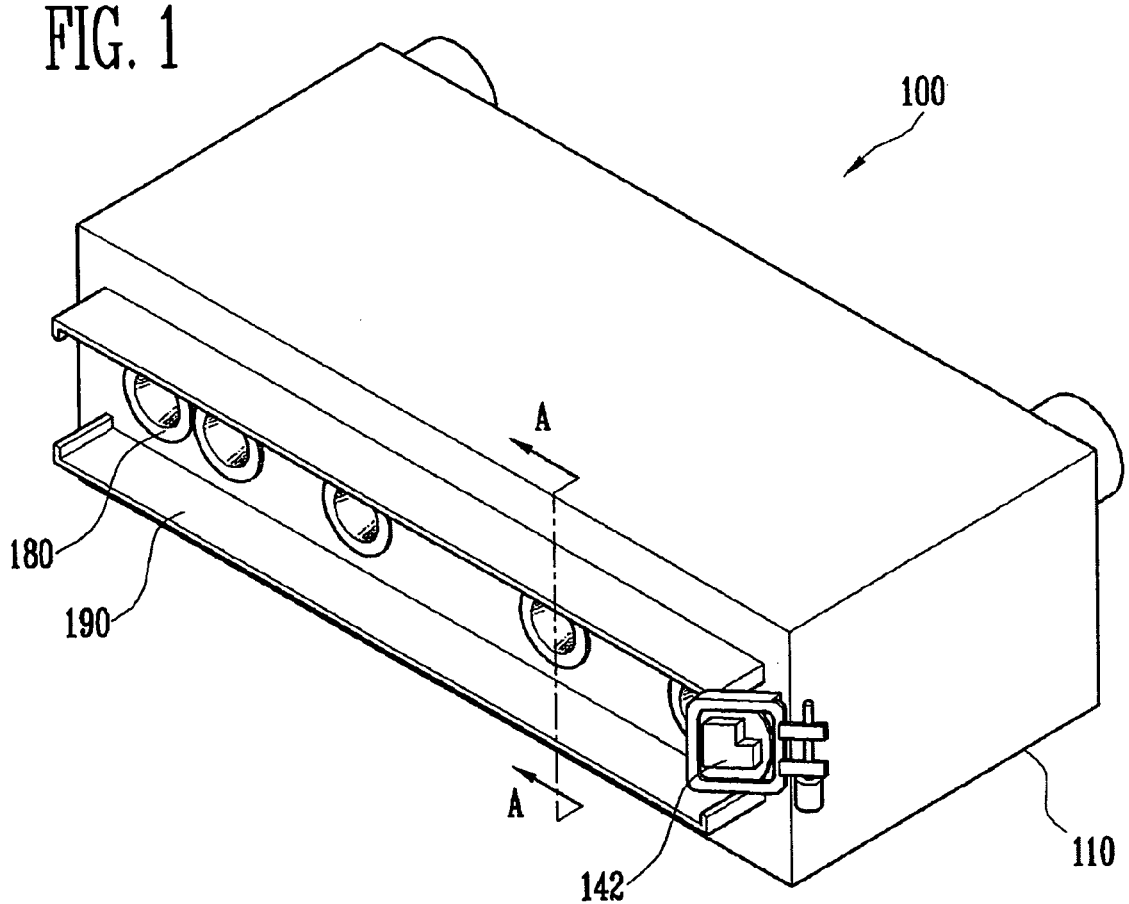
FIG. 1 is a perspective view of a vapor deposition source according to a preferred embodiment of the present invention.

Hereinafter, preferable embodiments of a vapor deposition source and a vapor deposition apparatus having the vapor deposition source according to the present invention will be described with reference to the accompanying drawings. In this regard, when one element is connected to another element, the one element may be not only directly connected to the other element but also indirectly connected to the other element via a third element. Furthermore, unrelated ro irrelevant elements are omitted for clarity. Also, like reference numerals refer to like elements throughout.

Figure 2:
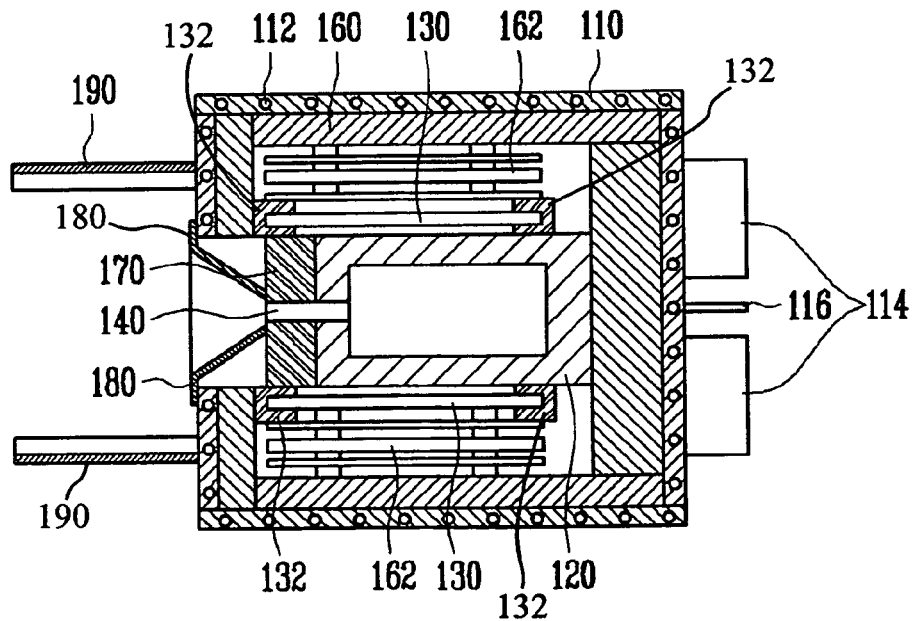
FIG. 2 is a cross-sectional view of the vapor deposition source taken along line A-A' of FIG. 1.

FIG. 1 is a perspective view of a vapor deposition source according to a preferred embodiment of the present invention, and FIG. 2 is a cross-sectional view of the vapor deposition source taken along line A-A' of FIG. 1.

With reference to FIG. 1 and FIG. 2, the vapor deposition source 100 of the present invention includes a housing 110, a crucible 120, a heater 130, adiabatic material 160, and an injection nozzle 140. The crucible 120 is mounted in the housing 110 and vaporizes deposition materials. The heater 130 is installed adjacent to the crucible 120 in the housing 110 and heats the crucible 120. The adiabatic material 160 includes a plurality of adiabatic materials enclosing the heating portion. The injection nozzle 140 communicates with the crucible 120 so as to inject the vaporized deposition materials into a substrate disposed at an exterior of the housing 110.

The crucible 120 receives deposition materials therein. A heater 130 is installed adjacent to the crucible 120, and heats the crucible 120. A reflector 162 is displaced from the heater 130 by a predetermined distance, and blocks heat of high temperature generated by the heater 130.

The heater 130 may be installed over an entire surface of the crucible 120 or on at least one selected surface thereof as needed. Furthermore, the injection nozzle 140 injects vaporized deposition materials from the crucible 120. A first heat blocking plate 180 is disposed at a front end of the injection nozzle 140 and blocks heat from the deposition materials. Second heat blocking plates 190 are formed so as to protrude from a peripheral surface of the housing 110 at upper and lower portions of the first heat blocking plate 180, and prevent the deposition materials and radiant heat from being spread. A thickness measuring device 142 is installed at one side of the vapor deposition source 100 and measures the deposition thickness of deposition materials injected through the injection nozzle 140.

Figure 3:
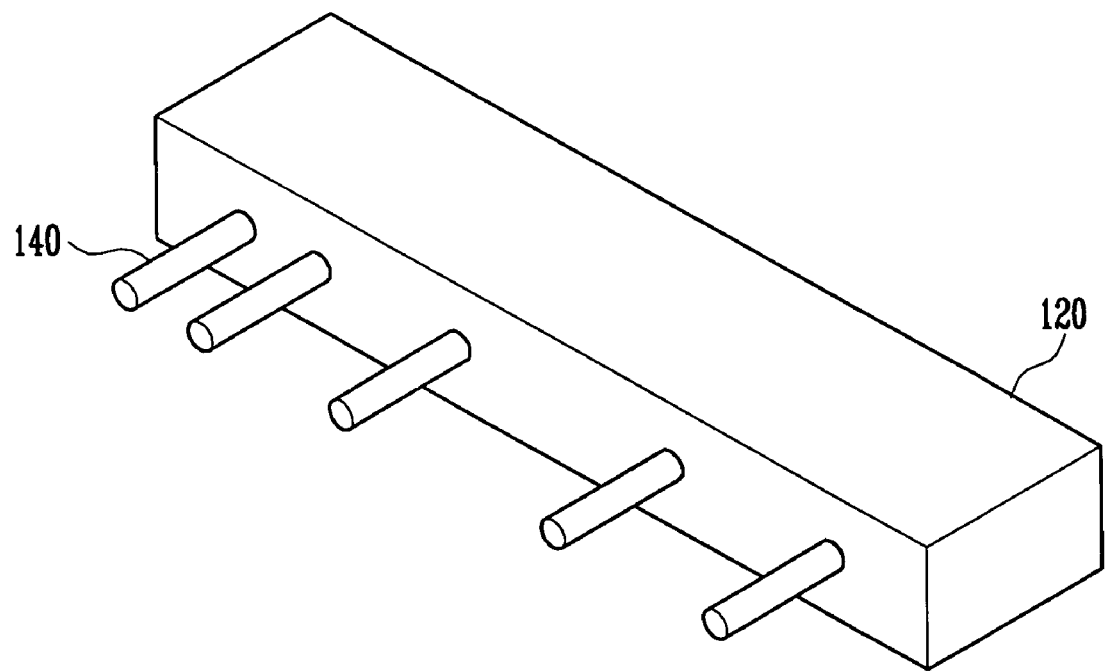
FIG. 3 is a perspective view of the crucible of FIG. 2.

FIG. 3 is a perspective view of the crucible shown in FIG. 2. As shown in FIG. 2 and FIG. 3, it is preferred that the crucible 120 be mounted in the housing 110 and have a rectangular shape so as to define an optimal receiving space. Injection nozzles 140 mounted in the crucible 120 are preferably disposed at predetermined intervals so as to have film formation uniformity in the substrate. In order to block radiant heat discharged from the crucible 120 through the injection nozzles 140 to the highest degree, it is preferred to minimize the areas of the injection nozzles 140. Accordingly, it is most preferred that each of the injection nozzles 140 have a diameter of 5 to 15 mm. The reason is that, when the diameter of the injection nozzle 140 is less than 5 mm, an insufficient amount of deposition materials is supplied to the substrate, resulting in non-uniform deposition. Moreover, when the diameter of the injection nozzle 140 is equal to or greater than 15 mm, heat equal to or greater than a predetermined value is irradiated, thereby causing an increase in the temperature of the substrate.

In addition, the nozzles 140 are preferably made of graphite. It is preferred that one to twenty injection nozzles 140 be selectively disposed for a substrate having a length of 1 m. This is for the purpose of transferring a minimum amount of radiant heat from the injection nozzles 140, while sufficiently transferring deposition materials, heated and vaporized in the vapor deposition source 100, onto the substrate through the injection nozzles 140.

Figure 4:
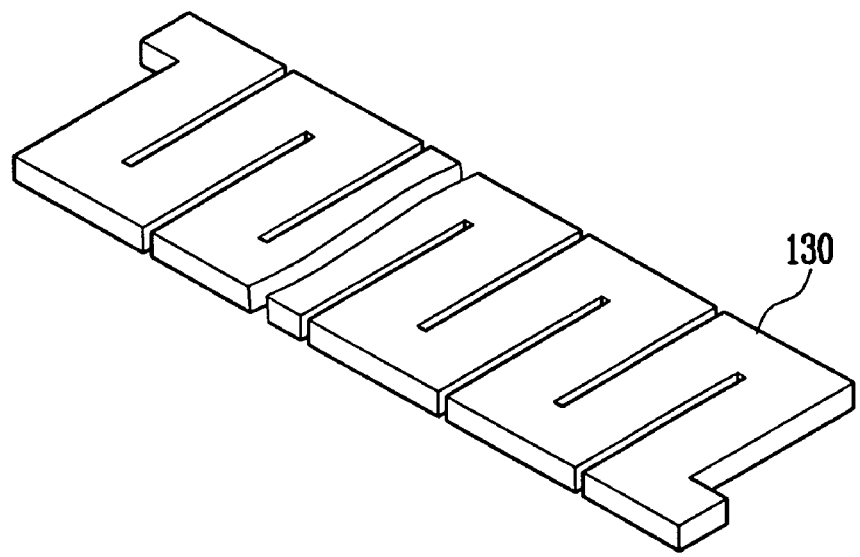
FIG. 4 is a perspective view of the plate heater of FIG. 2.

FIG. 4 is a perspective view of the plate heater of FIG. 2. As shown in FIG. 2 and FIG. 4, the plate heater 130 is used to heat the rectangular crucible 120. The plate heater 130 has a sufficient size to cover at least one side of the crucible 120, while having a constant width, height and length. The plate heater 130 may be manufactured with the crucible 120 received therein as needed.

Moreover, as shown in FIG. 4, the plate heater 130 has the shape of a plate which is alternatively bent on right and left sides so as to have a predetermined unit width. The reason is that the plate shape can generate a maximum amount of heat for the same area in consideration of heat conduction and resistance.

On the other hand, in order to apply an electric current to the plate heater 130, an electric wire (not shown) is coupled to the plate heater 130, and a power supply (not shown) is provided to supply power to the electric wire. In order to stably supply the power, a case 114 (FIG. 2) is installed so as to enclose a peripheral area of the power supply.

Furthermore, the housing 110 is a cooling jacket, and cooling passages 112 are formed in the body of the cooling jacket 110. The cooling passages 112 may be formed by pipes. In this case, one continuous pipe is bent so as to form the cooling passage(s) 112, which is (are) arranged uniformly over an entirety of the housing 110. Otherwise, a plurality of pipes may be disposed at respective parts of the housing 110 to form the cooling passages 112. Although not shown in drawings, a cooling water tank and a pump can be provided so that cooling water is introduced into and discharged from the cooling jacket 112.

Adiabatic material 160 (FIG. 2) is disposed at an inner surface of the housing 110. The adiabatic material 160 is one element of an adiabatic portion. The adiabatic material 160 blocks heat generated by the crucible 120 and the heater 130. Herein, the adiabatic material 160 is disposed so as to enclose an entire surface of the housing 110. Preferably, the adiabatic material 160 is made of graphite felt.

A nozzle adiabatic material 170 is disposed at a front end of the injection nozzle 140 so as to enclose the injection nozzle 140 disposed adjacent to the crucible 120. The nozzle adiabatic material 170 may be provided adjacent to the injection nozzle 140, together with the adiabatic material 160. Otherwise, the nozzle adiabatic material 170 can be disposed over the entirety of one side of the housing 120. The nozzle adiabatic material 170 functions to prevent the nozzle 140 from being condensed. The nozzle adiabatic material 170 is preferably made of graphite felt.

Furthermore, a first heat blocking plate 180 is disposed at an injection port of the injection nozzle 140 so as to block heat of deposition materials. A second heat blocking plate 190 protrudes from a peripheral surface of the housing 110, defined to include the first heat blocking plate 180. The first and second heat blocking plates 180 and 190, respectively, function not only to cause deposition materials to be deposited in a concentrated manner, but also to prevent radiant heat discharged together with the deposition materials from being spread. In this regard, an end of the injection nozzle 140 is arranged to extend to a contact surface of the nozzle adiabatic material 170. The first heat blocking plate 180 prevents deposition materials and heat injected through the injection nozzle 140 from contacting the adiabatic material 160 and the housing 110. The first heat blocking plate 180 has a hollow cone shape. An end of the first heat blocking plate 180 is bent outward to block heat from contacting an outer surface of the housing 110.

In addition, a plurality of heater support members 132 are provided to support the heater 130 installed adjacent to the crucible 120. The heater support members 132 are provided to support and insulate the heater 130. Although the heater support members 132 are preferably made of ceramic materials, they may be formed of boron nitride (BN) or aluminum oxide ($Al_2O_3$).

In the present invention, the heater 130 and the reflector 162 are symmetrically arranged around the crucible 120 so as to heat the crucible 120. A thermocouple 116 is installed at a rear surface of the housing 110, and controls temperature.

On the other hand, the present invention is not limited to an arrangement of the adiabatic portion and the heating blocking structure according to the aforementioned embodiments. In this regard, FIG. 5 is a cross-sectional view of a housing and an adiabatic portion of a vapor deposition source according to another embodiment of the present invention, and FIG. 6 is a cross-sectional view of a heat blocking structure of a vapor deposition source according to another embodiment of the present invention.

Figure 5:
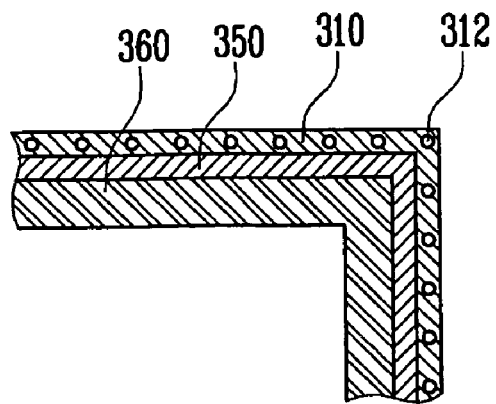
FIG. 5 is a cross-sectional view of a housing and an adiabatic portion of a vapor deposition source according to another embodiment of the present invention.
Figure 6:
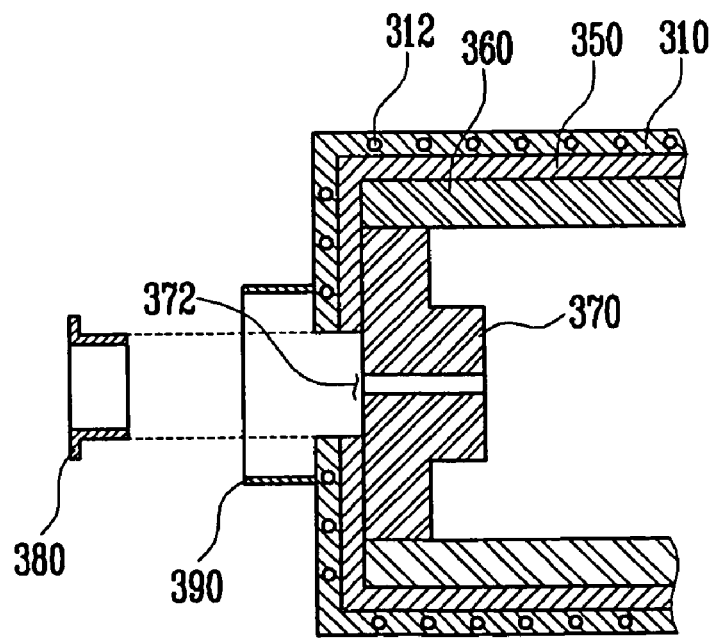
FIG. 6 is a cross-sectional view of a heat blocking structure of a vapor deposition source according to another embodiment of the present invention.

As seen in FIG. 5 and FIG. 6, an adiabatic material of the present invention may include a first adiabatic material 350 and a second adiabatic material 360. In this case, the first adiabatic material 350 is disposed so as to be stuck to an inner surface of the housing 310, and the second adiabatic material 360 is disposed so as to be stuck to an inner side surface of the first adiabatic material 350. The first adiabatic material 350 is preferably made of alumina ($Al_2O_3$) or mullite. The second adiabatic material 360 is preferably made of graphite felt.

Moreover, the housing 310 is formed with a cooling jacket 312. The cooling jacket 312 is formed in the body of the housing 310. The cooling jacket 312 may be composed of a pipe. A cooling water tank and a pump (not shown) can be provided so that cooling water is introduced into and discharged from the cooling jacket 312.

In addition, the first heat blocking plate 380 prevents deposition materials and heat injected through the injection nozzle 140 from contacting the first adiabatic material 350 and the housing 310. The first heat blocking plate 380 has a hollow cylindrical shape, and can be mounted adjacent to the first adiabatic material 350 and an injection port 372 formed in the housing 310. As shown in FIG. 6, the first heat blocking plate 380 is mounted in the injection port 372, and an end of the first heat blocking plate 380 is bent outward so that the first heat blocking plate 380 blocks heat from contacting an outer surface of the housing 110. As was the case with the second heat blocking plates 190 of FIG. 2 (described in paragraph [0033] above), second heat blocking plates 390 of FIG. 6 are formed so as to protrude from a peripheral surface of the housing 310 at upper and lower portions thereof, and prevent deposition materials and radiant heat from being spread.

Hereinafter, a vapor deposition apparatus having the vapor deposition source with the construction described above will be explained with reference to the accompanying drawings. In that regard, FIG. 7 is a schematic view of a vapor deposition apparatus having the vapor deposition source of FIG. 1.

Figure 7:
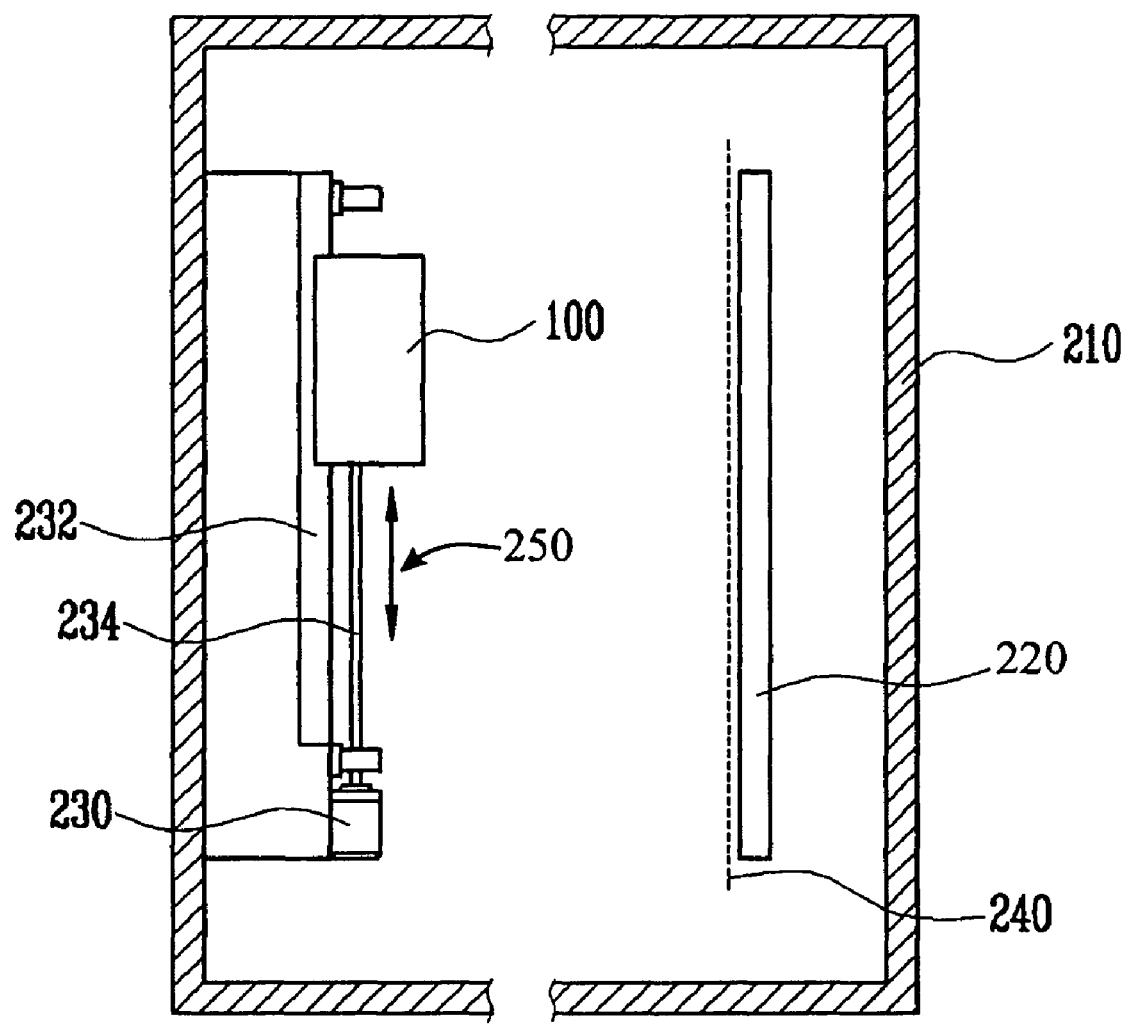
FIG. 7 is a schematic view of a vapor deposition apparatus having the vapor deposition source of FIG. 1.

With reference to FIG. 7, the vapor deposition apparatus 200 includes a vapor deposition source 100 and a conveyer 250. The vapor deposition source 100 is installed so as to face a substrate 220 which is vertically disposed. The vapor deposition source 100 reciprocates upward and downward and along the conveyer 250 so as to inject and deposit deposition materials on the substrate 220. The conveyer 250 functions to convey the vapor deposition source 100. Specifically, the vapor deposition source 100 is conveyed along a guide member 234 using a ball screw 232 rotated by a motor 230. Furthermore, a mask 240 is provided at a front surface of the substrate 220, and determines a deposition shape of the deposition materials.

Figure 8:
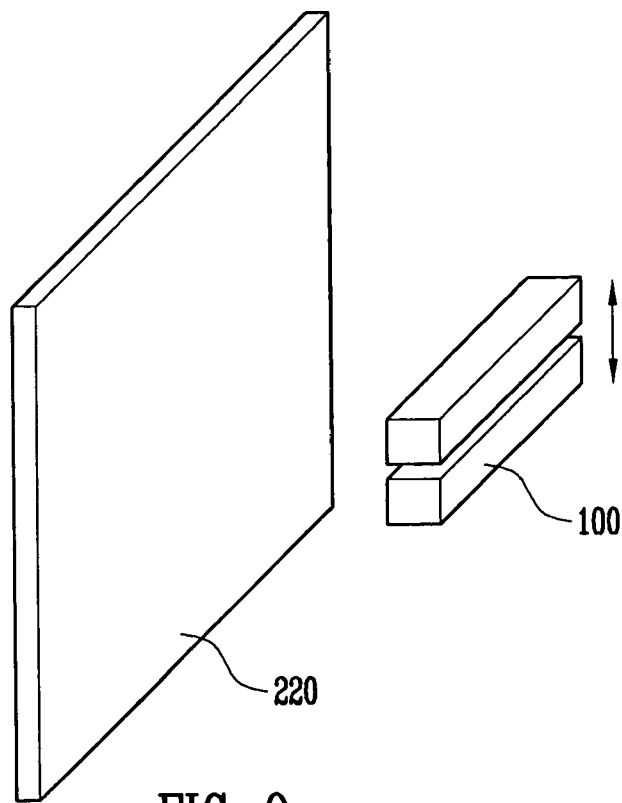
FIG. 8 is a perspective view of one example of the vapor deposition apparatus of FIG. 7.
Figure 9:
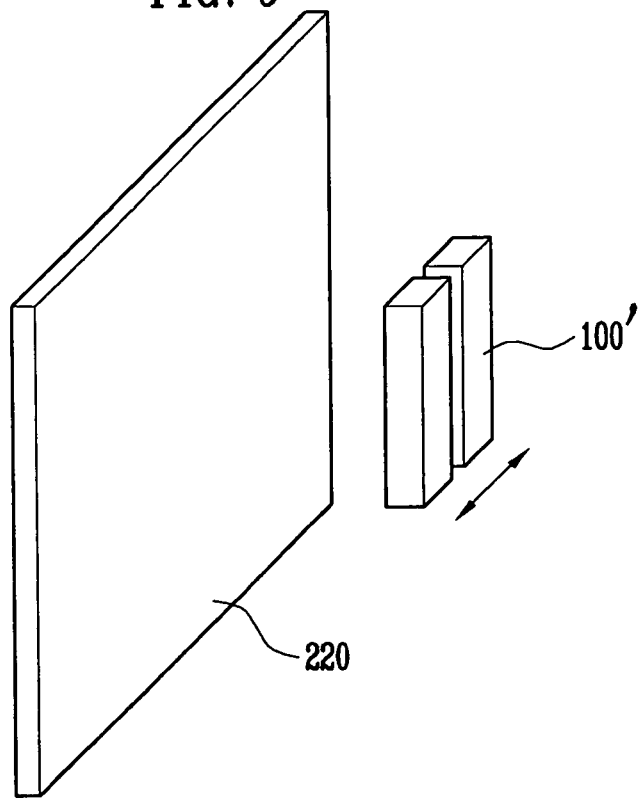
FIG. 9 is a perspective view of another example of the vapor deposition apparatus shown in FIG. 7.

FIG. 8 is a perspective view of one example of the vapor deposition apparatus of FIG. 7, and FIG. 9 is a perspective view of another example of the vapor deposition apparatus of FIG. 7. As shown in FIG. 8, two vapor deposition sources 100 may be horizontally arranged in a line so as to be moved upward and downward. As shown in FIG. 9, two vapor deposition sources 100' may be vertically arranged so as to be moved rightward and leftward. Herein, three or more vapor deposition sources can be installed. Horizontal or vertical arrangement of the vapor deposition sources 100 and 100' corresponds to an arrangement position of the injection nozzle 140.

Figure 10:
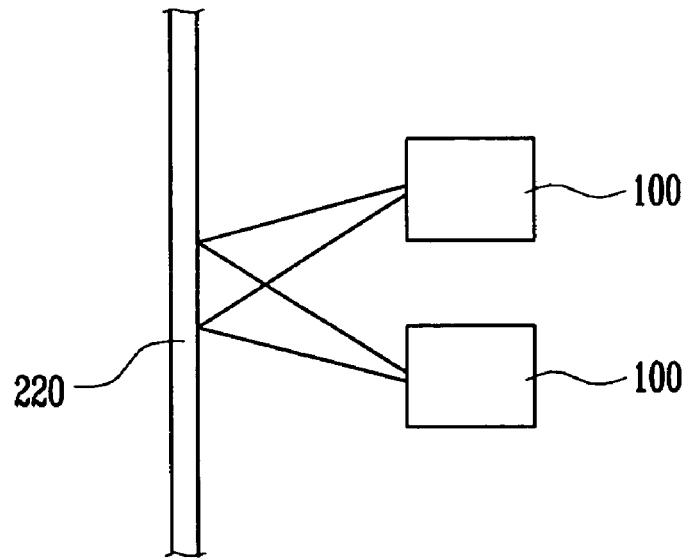
FIG. 10 is a side view of the vapor deposition source shown in FIG. 8 and FIG. 9, and an injection range of deposition materials injected from the vapor deposition source according to one embodiment of the present invention.
Figure 11:
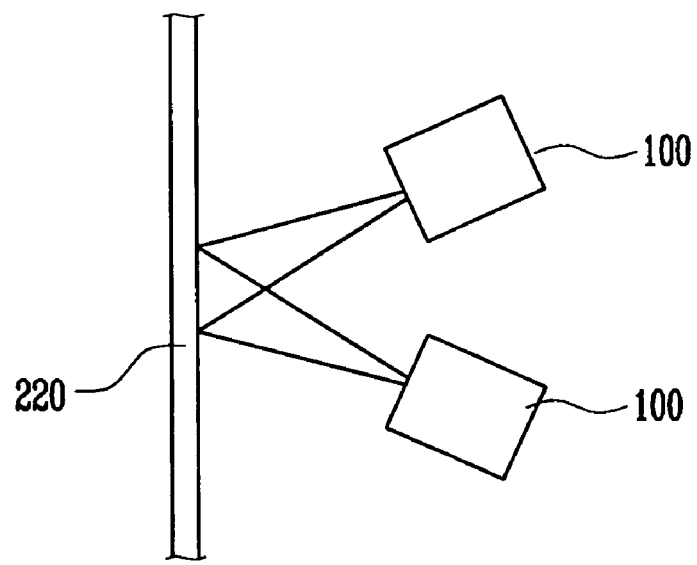
FIG. 11 is a side view of the vapor deposition source shown in FIG. 8 and FIG. 9, and an injection range of deposition materials injected from the vapor deposition source according to another embodiment of the present invention.

FIG. 10 is a side view of the vapor deposition source of FIG. 8 and FIG. 9, and an injection range of deposition materials injected from the vapor deposition source according to one embodiment of the present invention, while FIG. 11 is a side view of the vapor deposition source of FIG. 8 and FIG. 9, and an injection range of deposition materials injected from the vapor deposition source according to another embodiment of the present invention.

Referring to FIG. 10 and FIG. 11, deposition materials injected from two vapor deposition sources 100 are deposited on the substrate 220 so as to have an overlapped range. In order to have the overlapped range, as shown in FIG. 10, the injection nozzle 140 of FIG. 2 may be arranged so as to be inclined. As shown in FIG. 11, the vapor deposition source 100 is arranged so as to be inclined.

As mentioned above, according to the present invention, a crucible, a heating portion, and a nozzle portion are installed in one defined space. Accordingly, the vapor deposition source of the present invention is manufactured in a smaller and lightweight form, in contrast to a conventional vapor deposition source in which a crucible and a nozzle portion are arranged in different spaces. The diameter and the number of injection nozzles of the invention are restricted to block radiant heat discharged from the vapor deposition source, whereby deposition materials are uniformly deposited. Furthermore, in accordance with the invention, output power of a conveyer for conveying the vapor deposition source is reduced. In addition, a plurality of vapor deposition sources is arranged in a line so as to perform concentrated deposition of deposition materials, so that quality of the product is improved.

Although a few embodiments of the present invention have been shown and described, it will be appreciated by those skilled in the art that changes can be made to this disclosure without departing from the principles and spirit of the invention, the scope of which is defined in the claims and their equivalents.

What is claimed is:

1. A vapor deposition source, comprising:
   a housing;
   a crucible mounted in the housing for vaporizing deposition materials;
   at least one heater installed adjacent to the crucible in the housing for heating the crucible, said at least one heater comprises a plate heater; and
   an injection nozzle disposed to inject the vaporized deposition materials through the injection nozzle into a substrate disposed at an exterior of the housing;
   a first heat blocking plate disposed at a front end of the injection nozzle and blocking heat radiated through the injection nozzle, said first heat blocking plate being generally cylindrical in shape and having side portions continuously extending peripherally from a front side of said injection nozzle and mating against an exterior peripheral surface of the housing, and extending at respective angles greater than 0° and less than 90° relative to a central longitudinal axis of said injection nozzle; and
   at least two spaced-apart second heat blocking plates continuously protruding from and beyond the exterior peripheral surface of the housing on radially opposite sides of the first heat blocking plate, said at least two second heat blocking plates extending in a direction parallel to the central longitudinal axis of said injection nozzle, said at least two second heat blocking plates protruding farther from both sides of the first heat blocking plate.

2. A vapor deposition source according to claim 1, wherein the first heat blocking plate is also disposed at a peripheral surface of the housing adjacent to the injection nozzle.

3. The vapor deposition source according to claim 1, wherein said first heat blocking plate is conical in shape.

4. The vapor deposition source according to claim 1, wherein the injection nozzle is made of graphite and has a diameter in a range of 5 to 15 mm.

* * * * *